United States Patent
Pan et al.

(10) Patent No.: US 7,994,703 B2
(45) Date of Patent: Aug. 9, 2011

(54) ORGANIC LED DISPLAY APPARATUS WITH INSULATING MEMBER OVERLAYING OUTER LEADS AND MANUFACTURING METHOD THEREOF

(75) Inventors: Chun Hao Pan, Tainan (TW); Tzeng Cheng Luo, Taipei County (TW); Chung Che Tsou, Taoyuan County (TW)

(73) Assignee: Ritdisplay Corporation, Hsinchu (TW)

( * ) Notice: Subject to any disclaimer, the term of this patent is extended or adjusted under 35 U.S.C. 154(b) by 320 days.

(21) Appl. No.: 12/051,493

(22) Filed: Mar. 19, 2008

(65) Prior Publication Data

US 2008/0265745 A1  Oct. 30, 2008

(30) Foreign Application Priority Data

Apr. 25, 2007  (TW) ............................... 96114535 A

(51) Int. Cl.
*H01J 1/62* (2006.01)
*H01J 63/04* (2006.01)

(52) U.S. Cl. ........ 313/500; 313/498; 313/504; 313/506; 313/512

(58) Field of Classification Search .......... 313/498–512
See application file for complete search history.

(56) References Cited

U.S. PATENT DOCUMENTS

| | | | |
|---|---|---|---|
| 2003/0184217 A1* | 10/2003 | Yamazaki et al. | 313/505 |
| 2005/0056841 A1* | 3/2005 | Yamazaki et al. | 257/59 |
| 2005/0231107 A1* | 10/2005 | Yamazaki et al. | 313/506 |
| 2008/0018231 A1* | 1/2008 | Hirakata | 313/498 |
| 2008/0111481 A1* | 5/2008 | Seo et al. | 313/504 |

\* cited by examiner

*Primary Examiner* — Bumsuk Won
*Assistant Examiner* — Kevin Quarterman
(74) *Attorney, Agent, or Firm* — WPAT, P.C.; Anthony King

(57) ABSTRACT

An organic LED display apparatus comprises a substrate and an upper cover. The substrate comprises a display area, a plurality of inner leads and a plurality of outer leads. The upper cover overlays the display area and the plurality of inner leads, and is hermetically combined with the substrate by means of an encapsulating material. The plurality of outer leads is covered with an insulating material that is laid on the outer leads immediately after they are formed on the substrate. Therefore, the plurality of outer leads can be protected from scratches and damage.

7 Claims, 6 Drawing Sheets

ORGANIC LED DISPLAY APPARATUS WITH INSULATING MEMBER OVERLAYING OUTER LEADS AND MANUFACTURING METHOD THEREOF

BACKGROUND OF THE INVENTION

1. Field of the Invention

The present invention relates to an organic LED (OLED) display apparatus and a manufacturing method thereof, and more particularly relates to a structure for protecting lead wires of an organic light emitting diode display.

2. Description of the Related Art

In OLED display technology, a COF (chip on film) device is commonly used to connect to a glass substrate for display. A driving IC is directly mounted on a circuit film. In other words, COF is a method used to mount a chip of the driving IC onto a flexible printed circuit (FPC) board through flip chip bonding. Therefore, a thinner circuit film substitutes for a conventional thick printed circuit board so that such a display can have reduced weight, thickness, width and size.

COG (chip on glass) is another common technology applicable to the display glass substrate of an OLED display. A driving IC is directly mounted on the glass substrate. The main advantages of COG are as follows: the capacity of the whole package is increased, while the weight is reduced. The display panel is brighter and its manufacturing cost is reduced because fewer components are employed.

However, the lead wires of a conventional OLED display apparatus are not covered by the cover plate, so they are likely to be improperly touched and scratched during succeeding processes. Accordingly, the circuit including the damaged wires could be shorted or even burned out so that the display area of the OLED display apparatus cannot normally display any image. That is, an abnormal light line or an abnormal dark line occurs in the display area. In particular, an OLED display apparatus to which COG technology is applied is likely to be damaged because numerous unprotected and exposed wires or leads can easily be scratched, oxidized or peeled.

FIG. 1 is a top view of a conventional OLED display apparatus. An OLED display apparatus 10 comprises a display area 110 formed on a substrate 100, a plurality of inner leads 121 (cathode) and 122 (anode) and a plurality of outer leads 121' and 122'. The display area 110 comprises a plurality of anode lines, an organic light-emitting layer and a plurality of cathode lines (not shown) sequentially overlaid on the substrate 100. The display area 110 and the inner leads 121 and 122 are hermetically sealed by an upper cover 150 and the substrate 100. The outer leads 121' and 122' provided on the substrate 100 are located outside the upper cover 150, and respectively connected to the inner leads 121 and 122. A driver IC chip 160 mounted on the substrate 100 is located outside the upper cover 150, and electrically connected to outer leads 121' and 122' through a plurality of bumps (not shown) so as to control each pixel of the display area 110. Furthermore, a plurality of leads 180 on the substrate 100 are extended under the driver IC chip 160, and similarly are connected to the driver IC chip 160 through a plurality of bumps. The terminal of each lead 180 is connected to a contact 190 that is used to connect to a flexible printed circuit board 170.

FIG. 2 is a top view of the conventional OLED display apparatus in FIG. 1 with protection. The flexible printed circuit board 170 and contacts 190 are connected to each other. An encapsulation material 140 is disposed on the areas of the substrate 100 outside the upper cover 150. Because the outer leads 121' and 122' are not protected by any encapsulation material or any film during the succeeding processes after they are formed on the substrate 100, they can be easily scratched, oxidized or peeled. Such defects would exist before the encapsulation material 140 is finally applied to the substrate 100. Metallic leads with higher hardness can substitute the leads 121' and 122' to resolve such scratch problem, but the higher resistance of the metallic leads would negatively affect the electrical performance of the OLED display apparatus 10. In another solution, the widths of the outer leads 121' and 122' are widened to reduce the risk of complete breakage, but with such method the effective display areas of the OLED display apparatus 10 are more occupied by the leads with increased width. Using leads with widened width cannot meet the requirement of a miniaturized OLED display apparatus. Therefore, the package structure of the conventional OLED display apparatus 10 results in a low manufacturing yield, so the protecting structure of the outer leads 121' and 122' should be improved so as to increase the manufacturing yield.

SUMMARY OF THE INVENTION

An objective of the present invention is to provide an organic LED display apparatus and a manufacturing method thereof. The protecting structure of the outer leads is modified so that they can be prevented from scratching, oxidizing or peeling, and hence the organic LED display apparatus has high quality, long life, excellent manufacturing yield and low cost.

In order to achieve the above objective, the present invention provides an organic LED display apparatus comprising a substrate and an upper cover. The substrate comprises a display area, a plurality of inner leads and a plurality of outer leads. The upper cover overlays the display area and the plurality of inner leads, and is hermetically combined with the substrate by means of an encapsulating material. The plurality of outer leads is covered with an insulating material which is laid on the outer leads immediately after they are formed on the substrate. Therefore, the plurality of outer leads can be prevented from scratches and damage.

The present invention further provides a method for manufacturing an organic LED display apparatus, comprising the steps of: forming a plurality of inner leads and a plurality of outer leads on a substrate; overlaying a insulating material on the outer leads; forming a display area on the substrate connected to the plurality of outer leads; and overlaying an encapsulating material on the plurality of outer leads and the insulating material.

BRIEF DESCRIPTION OF THE DRAWINGS

The invention will be described according to the appended drawings in which.

PREFERRED EMBODIMENT OF THE PRESENT INVENTION

Figure 1:
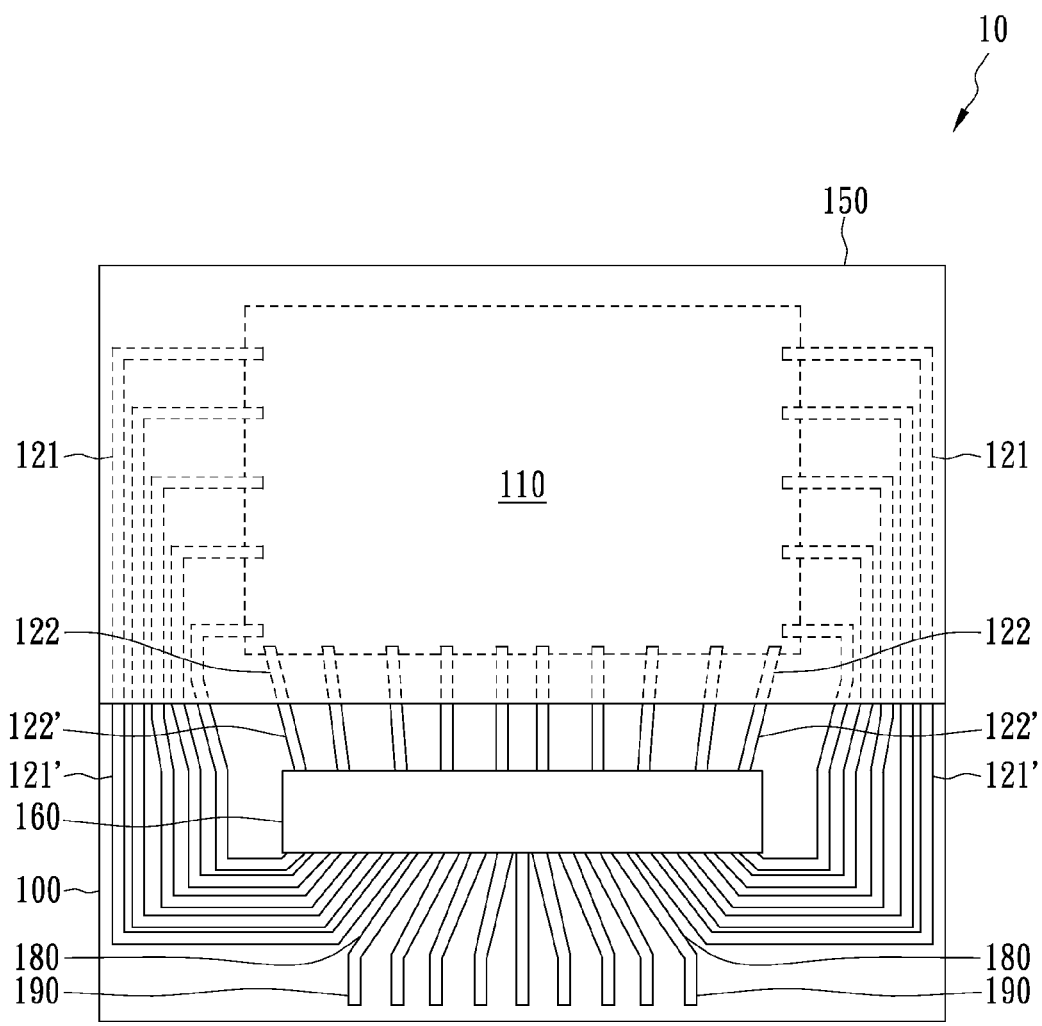
FIG. 1 is a top view of a conventional OLED display apparatus.
Figure 2:
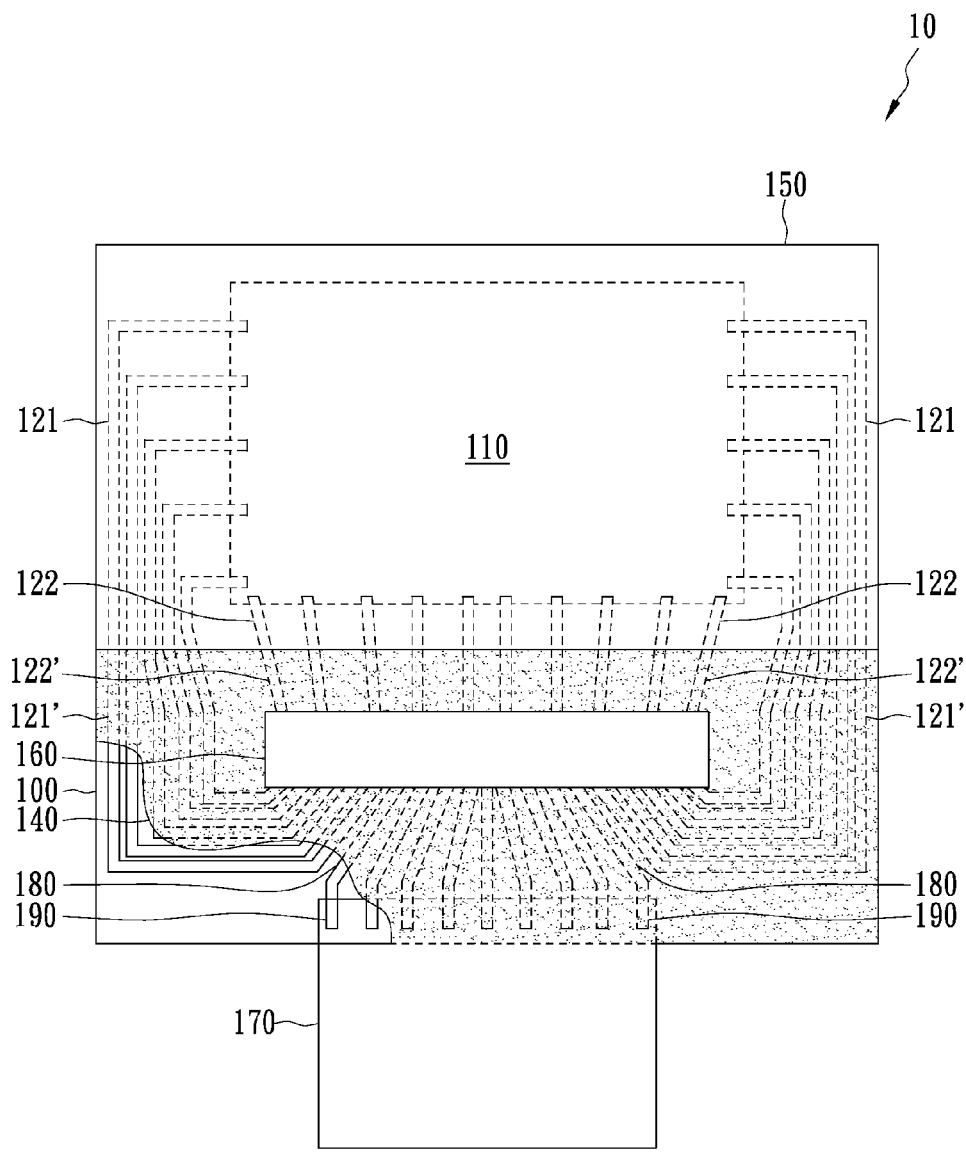
FIG. 2 is a top view of the conventional OLED display apparatus in FIG. 1 with protection.
Figure 3:
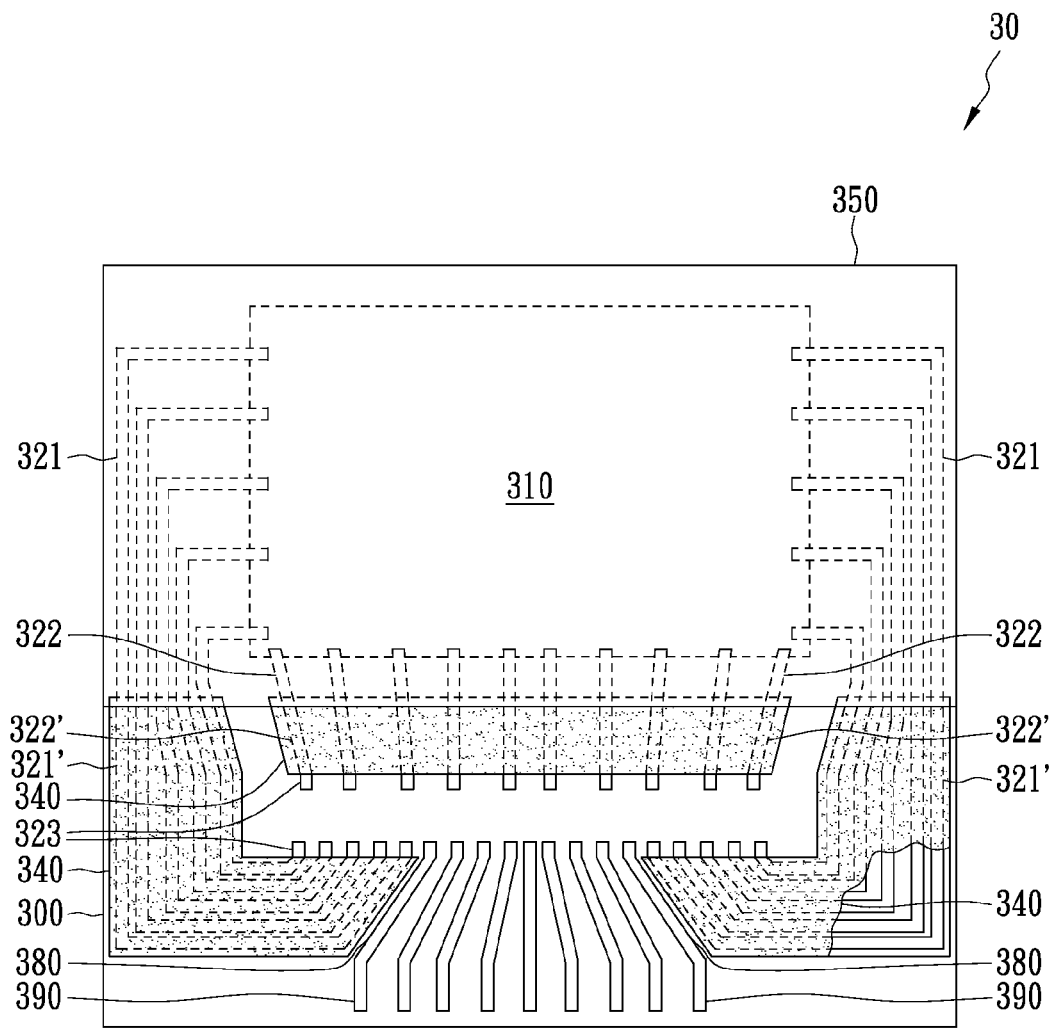
FIG. 3 is a top view of an organic LED display apparatus in accordance with the present invention.

FIG. 3 is a top view of an organic LED display apparatus in accordance with the present invention. An organic LED display apparatus 30 comprises a display area 310 formed on a substrate 300, a plurality of inner leads 321 (cathode), 322 (anode) and a plurality of outer leads 321' (cathode), 322'. The plurality of inner leads 321, 322 and the plurality of outer leads 321', 322' are wire patterns previously defined on the substrate 300, and the light-emitting diode of each pixel is formed on the display area. Subsequently, the plurality of outer leads 321', 322' is covered with an insulating material 340 after the plurality of inner leads 321, 322 and the plurality of outer leads 321', 322' are completely formed. Therefore, the plurality of outer leads 321', 322' can be protected from scratches and damage.

A proper photoresist material, a high polymer material or an inorganic insulating material can be employed as the insulating material 340, and its pattern can be well defined during a photolithograph process through yellow light. Therefore, the insulating material 340 protects the outer leads 321', 322' from any damage when the succeeding film plating, encapsulating and module processes are sequentially performed. Furthermore, the insulating material 340 can be coated on the substrate 300 by spinning, spray, sputter deposition or vapor deposition, and then the final covering areas is defined by the yellow light photolithograph process.

The display area 310 comprises a plurality of anode lines, an organic light-emitting layer and a plurality of cathode lines (not shown) sequentially overlaid on the substrate 300. The display area 310 and the inner leads 321 and 322 are hermetically sealed by an upper cover 350 and the substrate 300. The outer leads 321' and 322' provided on the substrate 300 are located outside the upper cover 350. Terminals of the outer leads 321' and 322' are respectively connected to the inner leads 321 and 322, and terminals opposite to those are respectively connected to contacts 323. Furthermore, a plurality of leads 380 on the substrate 300 are extended under a driver IC chip 360 (as shown in FIG. 4), and the terminal of each lead 380 is connected to a contact 390 that is used to connect to a flexible printed circuit board 370 (as shown in FIG. 4).

Figure 4:
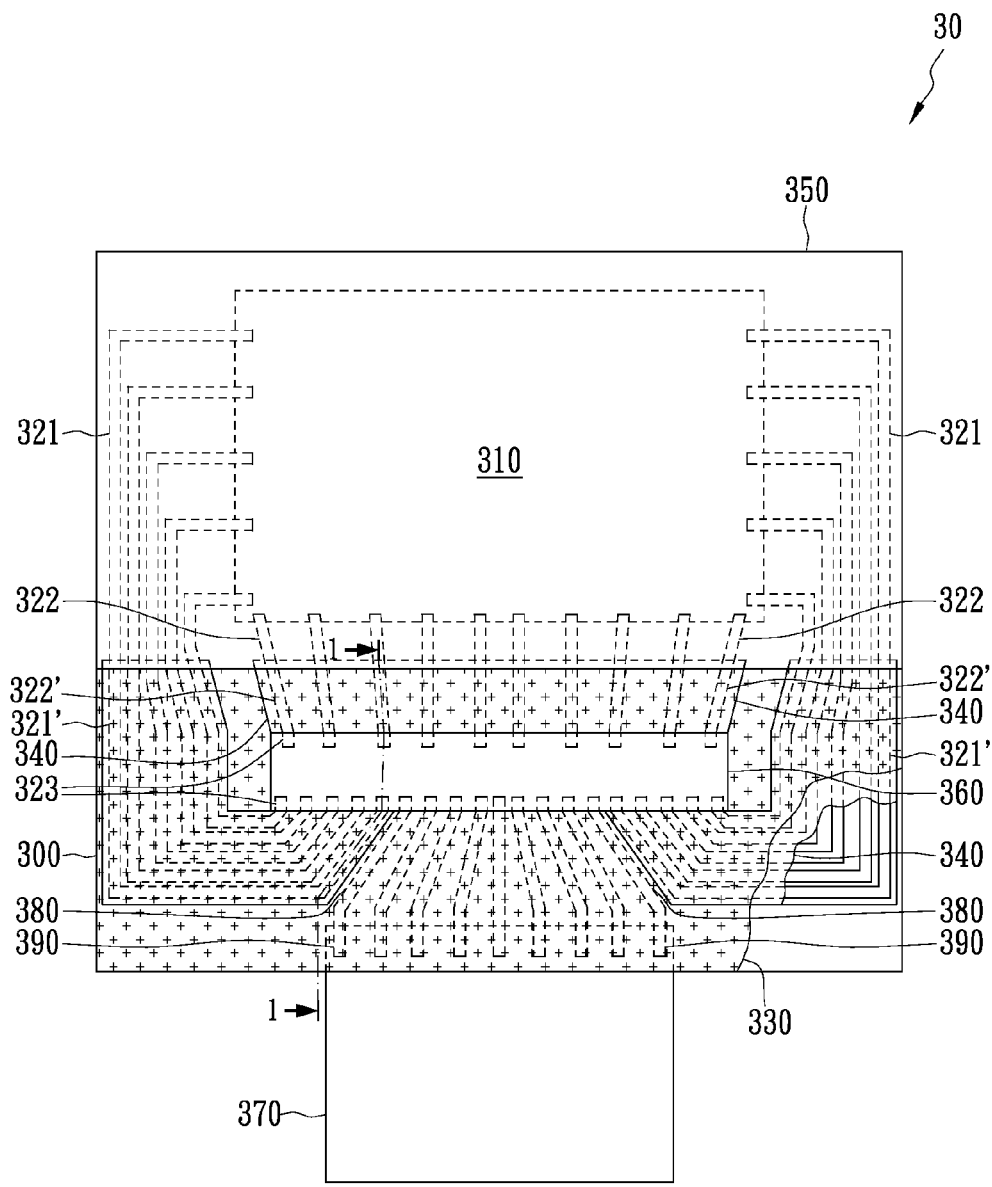
FIG. 4 is a top view of the organic LED display apparatus in FIG. 3 with a further layer in accordance with the present invention.

FIG. 4 is a top view of the organic LED display apparatus in FIG. 3 with a further layer in accordance with the present invention. The driver IC chip 360 mounted on the substrate 300 is located outside the upper cover 350, and electrically connected to the contacts 323 through a plurality of bumps (not shown) so as to control each pixel of the display area 310. Furthermore, after the flexible printed circuit board 370 is connected to the contacts 390, an encapsulating material 330 is overlaid on the area where the substrate 300 is not covered by the upper cover 350.

Figure 5:
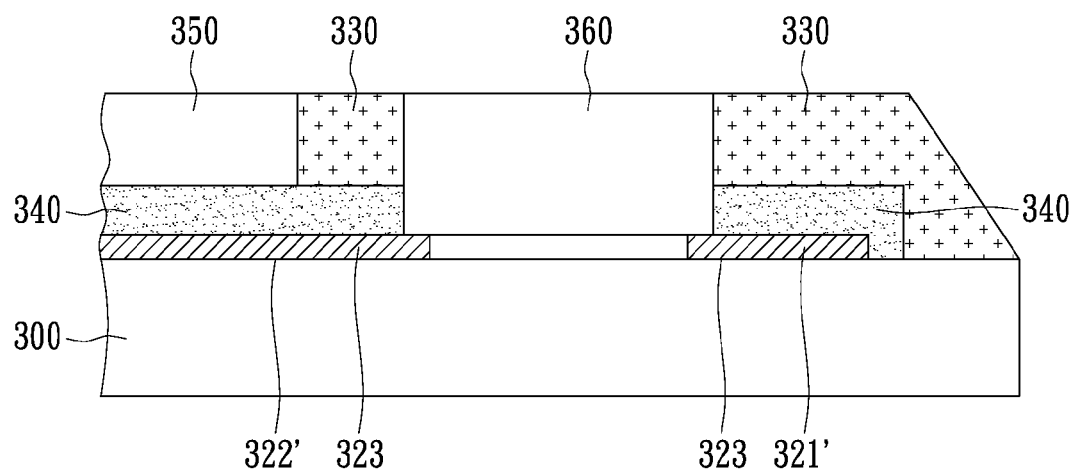
FIG. 5 is a cross-sectional diagram along line 1-1 in FIG. 4.

FIG. 5 is a cross-sectional diagram along line 1-1 in FIG. 4. As shown in this figure, the outer leads 322' are covered with the insulating material 340, and the encapsulating material 330 is further overlaid on the insulating material 340. Consequentially, moisture and air cannot penetrate the interior of the organic LED display apparatus 30 and the circuits are protected from oxidation and corrosion. The total thickness of the apparatus 30 remains the same as that of the conventional organic LED display apparatus despite the addition of the insulating material 340.

Figure 6:
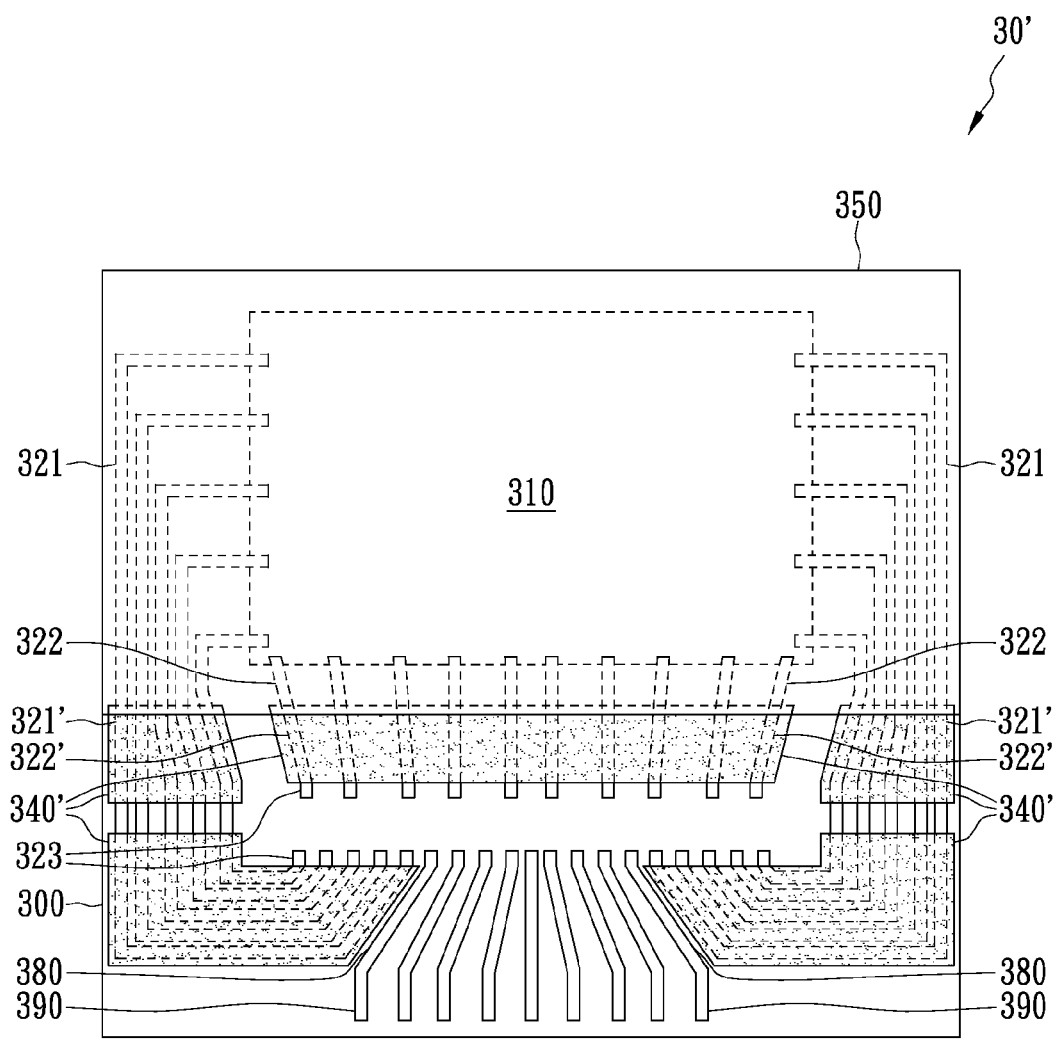
FIG. 6 is a top view of an organic LED display apparatus in accordance with another embodiment of the present invention.

FIG. 6 is a top view of an organic LED display apparatus in accordance with another embodiment of the present invention. Compared with FIG. 3, areas of the outer leads 321' located on two sides of the substrate 300 are exposed to an encapsulating material 340', and they can be contacted by probes during an electrical testing process.

The aforementioned descriptions of the present invention are intended to be illustrative only. Numerous alternative methods may be devised by persons skilled in the art without departing from the scope of the following claims.

What is claimed is:

1. An organic LED display apparatus, comprising:
   a substrate comprising a display area, a plurality of inner leads and a plurality of outer leads, wherein the inner leads are respectively connected to the outer leads;
   an upper cover overlaying the display area and the plurality of inner leads;
   an insulating material directly overlaying whole areas of the outer leads and some areas of the inner leads adjacent to the outer leads, and below a top surface of the upper cover facing away from the substrate;
   wherein the inner leads is between the substrate and the upper cover and the outer leads are not covered by the upper cover; and
   an encapsulation layer overlaying above whole areas of the outer leads and directly overlaying the insulating material outside the upper cover.

2. The organic LED display apparatus of claim 1, wherein the insulating material is a photoresist material, a polymer material or an inorganic insulating material.

3. The organic LED display apparatus of claim 1, wherein the inner leads are connected to the display area.

4. The organic LED display apparatus of claim 1, further comprising a driver IC chip mounted on the substrate and outside the upper cover, wherein the driver IC is electrically connected to the outer leads.

5. The organic LED display apparatus of claim 4, further comprising a flexible printed circuit board disposed on a surface of the substrate outside the upper cover, wherein the flexible printed circuit board is electrically connect to the driver IC.

6. An organic LED display apparatus, comprising:
   a substrate comprising a display area, a plurality of inner leads and a plurality of outer leads, wherein the inner leads are respectively connected to the outer leads;
   an upper cover overlaying the display area and the plurality of inner leads; and
   an insulating material directly overlaying whole areas of the outer leads;
   an encapsulation layer overlaying the whole insulating material outside the upper cover.

7. An organic LED display apparatus, comprising:
   a substrate comprising a display area, a plurality of inner leads, a plurality of outer leads, and a chip mounting area, wherein the inner leads are respectively connected to the outer leads;
   an upper cover overlaying the display area and the plurality of inner leads; and
   an insulating material directly overlaying whole areas of the outer leads;
   an encapsulation layer overlaying whole areas of the substrate outside the upper cover except the chip mounting area.

* * * * *